United States Patent
Chuang et al.

(10) Patent No.: US 9,693,468 B2
(45) Date of Patent: Jun. 27, 2017

(54) PACKAGE SUBSTRATE AND MANUFACTURING METHOD THEREOF

(71) Applicant: Subtron Technology Co., Ltd., Hsinchu County (TW)

(72) Inventors: Chih-Hong Chuang, Hsinchu County (TW); Chien-Hung Wu, Hsinchu County (TW)

(73) Assignee: Subtron Technology Co., Ltd., Hsinshu County (TW)

( * ) Notice: Subject to any disclaimer, the term of this patent is extended or adjusted under 35 U.S.C. 154(b) by 0 days.

(21) Appl. No.: 14/846,991

(22) Filed: Sep. 7, 2015

(65) Prior Publication Data

US 2017/0006713 A1    Jan. 5, 2017

(30) Foreign Application Priority Data

Jun. 30, 2015 (TW) .............................. 104121019 A (51) Int. Cl.
H05K 3/00         (2006.01)
H05K 3/40         (2006.01)
(Continued)

(52) U.S. Cl.
CPC ....... *H05K 3/4682* (2013.01); *H01L 21/4857* (2013.01); *H01L 21/6835* (2013.01);
(Continued)

(58) Field of Classification Search
CPC .. H05K 3/00; H05K 3/40; H05K 3/46; H05K 3/46; H05K 3/468; H05K 3/468;
(Continued)

(56) References Cited

U.S. PATENT DOCUMENTS

2001/0027875 A1    10/2001  Kim et al.
2010/0096078 A1    4/2010   Nakamura et al.
(Continued)

FOREIGN PATENT DOCUMENTS

JP    2008218450    9/2008
JP    2011199077    10/2011
(Continued)

OTHER PUBLICATIONS

"Search report of Europe Counterpart Application", issued on Oct. 28, 2016, p. 1-p. 8.
(Continued)

*Primary Examiner* — Michael N Orlando
*Assistant Examiner* — Matthew Hoover
(74) *Attorney, Agent, or Firm* — Jianq Chyun IP Office (57) ABSTRACT

A method of manufacturing a package substrate is provided. A first copper layer and a first plating copper layer formed thereon, a first dielectric layer, a second copper layer and a second plating copper layer formed thereon, a second dielectric layer, a third copper layer and a third plating copper layer formed thereon are provided and laminated, so that the first and the second dielectric layers encapsulate edges of the second copper layer and the second plating copper layer to form a temporary carrier. Two circuit structures are formed on two opposite surfaces of the temporary carrier. The temporary carrier and the circuit structures are cut to expose the edges of the second copper layer and the second plating copper layer, and separated along the exposed edges of the second copper layer and the second plating copper layer to form two package substrates independent from each other.

7 Claims, 6 Drawing Sheets (51) Int. Cl.
  *H01K 1/00* (2006.01)
  *H05K 3/46* (2006.01)
  *H01L 21/48* (2006.01)
  *H01L 21/683* (2006.01)
  *H05K 1/02* (2006.01)
  *H05K 1/09* (2006.01)
  *H05K 1/11* (2006.01)
  *H05K 3/18* (2006.01)
  *H01L 23/498* (2006.01)

(52) U.S. Cl.
  CPC .............. *H05K 1/0298* (2013.01); *H05K 1/09* (2013.01); *H05K 1/115* (2013.01); *H05K 3/18* (2013.01); *H05K 3/4038* (2013.01); *H05K 3/4638* (2013.01); *H01L 23/49822* (2013.01); *H01L 2221/68345* (2013.01); *H01L 2221/68381* (2013.01); *H05K 2201/09509* (2013.01); *H05K 2203/03* (2013.01)

(58) Field of Classification Search
  CPC .......... H05K 3/4682; H05K 3/10; H05K 3/18; H05K 3/40; H05K 3/403; H05K 3/403; H05K 3/4038; H05K 3/463; H05K 3/463; H05K 3/4638; H01K 21/40; H01K 21/48; H01K 21/48; H01K 21/485; H01K 21/485; H01K 21/4857; H01K 21/60; H01K 21/68; H01K 21/68; H01K 21/683; H01K 21/683; H01K 21/6835; H01K 1/00; H01K 1/02; H01K 1/02; H01K 1/029; H01K 1/029; H01K 1/0298; H01K 1/09; H01K 1/10; H01K 1/11; H01K 1/11; H01K 1/115
  See application file for complete search history.

(56) References Cited

U.S. PATENT DOCUMENTS

| | | | |
|---|---|---|---|
| 2010/0155116 A1 | 6/2010 | Kawai et al. | |
| 2010/0288549 A1 | 11/2010 | Chiang et al. | |
| 2010/0314037 A1* | 12/2010 | Liu | H01L 21/6835 156/248 |
| 2011/0154657 A1 | 6/2011 | Chuang et al. | |
| 2012/0205039 A1 | 8/2012 | Yamada et al. | |
| 2014/0014398 A1* | 1/2014 | Kim | H05K 3/4682 174/250 |

FOREIGN PATENT DOCUMENTS

| | | |
|---|---|---|
| JP | 2015070263 | 4/2015 |
| TW | 201124028 | 7/2011 |
| TW | 201422420 | 6/2014 |

OTHER PUBLICATIONS

"Office Action of Japan Counterpart Application", issued on Nov. 1, 2016, p. 1-p. 6.

"Office Action of Taiwan Counterpart Application", issued on Aug. 22, 2016, p. 1-p. 4.

* cited by examiner

PACKAGE SUBSTRATE AND MANUFACTURING METHOD THEREOF

CROSS-REFERENCE TO RELATED APPLICATION

This application claims the priority benefit of Taiwan application serial no. 104121019, filed on Jun. 30, 2015. The entirety of the above-mentioned patent application is hereby incorporated by reference herein and made a part of this specification.

BACKGROUND OF THE INVENTION

Field of the Invention

The invention relates to a package substrate and a manufacturing method thereof, and relates particularly to a coreless package substrate and a manufacturing method thereof.

Description of Related Art

In a semiconductor manufacturing process, a chip packaging substrate is one of the basic building blocks of packaging components. The chip packaging substrate, for example, may be a single-layer circuit board, a two-layer circuit board or a multi-layer circuit board which is constituted by alternatively stacking a plurality of circuit layers and a plurality of dielectric layers. In general, the circuit layers and the dielectric layers in the multi-layer circuit board are built up on a core substrate with a certain thickness. Along with the development of thin electronic components, the thickness of the core substrate is reduced accordingly. However, with the reduction in the thickness of the core substrate, the degree of difficulty in handling, the failure rate of the substrate manufacturing process and the packaging process all increase due to insufficient rigidity of the thin core substrate.

Hence, by using the coreless process in the manufacturing of the multi-layer circuit board, the problems arising in the substrate and the packaging process can be solved. In the coreless process, the core substrate is not used. A carrier panel serves as a temporary support to form build-up circuit layers thereon. After the multi-layer circuit board is completed, it is separated from the carrier. In the conventional coreless process, a part of the edges of the carrier and a part of the edges of the multi-layer circuit board are bonded together. After the manufacturing processes are completed (e.g., etching, circuit lamination, or laser drill), the edges of the carrier bonded with the multi-layer circuit board are routed out leaving the multi-layer circuit board without the edge areas for the subsequent processes. However, when a thickness of the package substrate becomes thinner, in the conventional coreless process, relative movements are easily produced during the manufacturing processes since the carrier and the multi-layer circuit board are only bonded together at particular parts, or deformation is produced at parts where the carrier and the multi-layer circuit are not bonded, further increasing the failure rate of the coreless manufacturing process. How to provide a stable temporary carrier and increase the yield of the manufacturing process and the subsequent separation process is a problem needing to be solved.

SUMMARY OF THE INVENTION

The invention provides a package substrate and a manufacturing method thereof, wherein the strength and swelling-shrinkage uniformity of a temporary carrier is enhanced effectively, and has an advantage of separating the plates easily and increasing the yield of the manufacturing process and separating the plates.

The manufacturing method of a package substrate of the invention includes the following steps. Providing a first copper layer and a first plating copper layer formed thereon, a first dielectric layer, a second copper layer and a second plating copper layer formed thereon, a second dielectric layer, a third copper layer and a third plating copper layer formed thereon. The first dielectric layer is located between the first copper layer and the second copper layer and the second dielectric layer is located between the second plating copper layer and the third copper layer. The edges of the second copper layer are retracted a distance compared to edges of the first copper layer and edges of the third copper layer. Laminating the first copper layer, the first dielectric layer, the second copper layer, the second dielectric layer and the third copper layer such that the first dielectric layer and the second dielectric layer completely encapsulate the edges of the second copper layer and the edges of the second plating copper layer thereon so as to form a temporary carrier, and wherein the edges of the first copper layer and the edges of the third copper layer are substantially aligned with each other. Forming two circuit structures on two opposite surfaces of the temporary carrier, wherein each of the circuit structures include at least two patterned circuit layers, an insulation layer located between the patterned circuit layers, and a plurality of conductive through hole structures penetrating the insulation layer and electrically connected with the patterned circuit layers. Cutting the temporary carrier and the circuit structures so as to expose the edges of the second copper layer and the edges of the second plating copper layer. Separating the temporary carrier and the circuit structures along the exposed edges of the second copper layer and the exposed edges of the second plating copper layer so as to form two package substrates independent from each other.

In an embodiment of the invention, a thickness of the first copper layer, a thickness of the second copper layer and a thickness of the third copper layer are greater than a thickness of the first plating copper layer, a thickness of the second plating copper layer and a thickness of the third plating copper layer respectively.

In an embodiment of the invention, the thickness of the first copper layer, the thickness of the second copper layer and the thickness of the third copper layer are between 10 micrometers and 35 micrometers.

In an embodiment of the invention, the thickness of the first plating copper layer, the thickness of the second plating copper layer and the thickness of the third plating copper layer are between 1 micrometer and 7 micrometers.

In an embodiment of the invention, the a method for laminating the first copper layer, the first dielectric layer, the second copper layer, the second dielectric layer and the third copper layer is thermo-compression bonding.

In an embodiment of the invention, the step of forming the two circuit structures on the two opposite surfaces of the temporary carrier includes, respectively forming a patterned circuit layer on the two opposite surfaces of the temporary carrier, wherein the patterned circuit layers respectively expose a part of the first plating copper layer and a part of the third plating copper layer. An insulation layer and a circuit layer thereon are respectively laminating on the patterned circuit layers. A part of the insulation layers and the circuit layer are removed so as to form a plurality of blind holes exposing the patterned circuit layers. The conductive through hole structures are formed in the blind holes, wherein the conductive through hole structures fill the blind holes and are connected to the circuit layers. The circuit layers are patterned to form another two patterned circuit layers, wherein the patterned circuit layers are electrically connected with the another two patterned circuit layer through the conductive through hole structures.

In an embodiment of the invention, the step of separating the temporary carrier and the circuit structures along the exposed edges of the second copper layer and the edges of the second plating copper layer includes, performing a first separation process, so as to separate the second copper layer and the second plating copper layer. Performing a second separation process, so as to separate the first copper layer and the third copper layer from the first plating copper layer and the third plating copper layer respectively. Performing a third separation process, so as to separate the first plating copper layer and the third plating copper layer from the patterned circuit layers respectively so as to form the package substrates independent from each other.

The circuit board of the invention includes a first copper layer, a second copper layer, a third copper layer, a first plating copper layer, a second plating copper layer, a third plating copper layer, a first dielectric layer and a second dielectric layer. The second copper layer is located between the first copper layer and the third copper layer, and edges of the second copper layer are retracted a distance compared to edges of the first copper layer and edges of the third copper layer. The first plating copper layer is disposed on the first copper layer, and directly covering the first copper layer. The second plating copper layer is disposed on the second copper layer, and directly covering the second copper layer. The third plating copper layer is disposed on the third copper layer, and directly covering the third copper layer. The first dielectric layer is disposed between the first copper layer and the second copper layer. The second dielectric layer is disposed between the second plating copper layer and the third copper layer, wherein the first dielectric layer and the second dielectric layer completely encapsulate the edges of the second copper layer and the edges of the second plating copper layer.

In an embodiment of the invention, a thickness of the first copper layer, a thickness of the second copper layer and a thickness of the third copper layer are greater than a thickness of the first plating copper layer, a thickness of the second plating copper layer and a thickness of the third plating copper layer respectively.

In an embodiment of the invention, the thickness of the first copper layer, the thickness of the second copper layer and the thickness of the third copper layer are between 10 micrometers and 35 micrometers.

In an embodiment of the invention, the thickness of the first plating copper layer, the thickness of the second plating copper layer and the thickness of the third plating copper layer are between 1 micrometer and 7 micrometers.

In an embodiment of the invention, the first plating copper layer and the third plating copper layer are located on outer sides of the first copper layer and the third copper layer respectively.

In an embodiment of the invention, the edges of the first dielectric layer and the edges of the second dielectric layer are substantially aligned with the edges of the first copper layer and the edges of the third copper layer.

Based on the above, since the first dielectric layer and the second dielectric layer of the invention completely encapsulate the edges of the second copper layer and the second plating copper layer which have edges retracted at a distance with respect to the first copper layer and the third copper layer, and the edges of the first dielectric layer and the edges of the second dielectric layer are substantially aligned with the edges of the first copper layer and the edges of the third copper layer, namely dielectric layers may completely seal the second copper layer and the second plating copper layer, so as to form a completely sealed border, therefore the temporary carrier of the invention may have strong sealed borders. In addition, since the first dielectric layer and the second dielectric layer completely encapsulate the edges of the second copper layer and the edges of the second plating copper layer, therefore the strength and swelling-shrinkage uniformity of the temporary carrier may be enhanced effectively. In addition, the temporary carrier and the circuit structures are separated along the edges of the second copper layer and the edges of the second plating copper layer which are exposed due to cutting the temporary carrier and the circuit structures so as to form two independent package substrates, and therefore may have the advantage of separating the plates easily.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
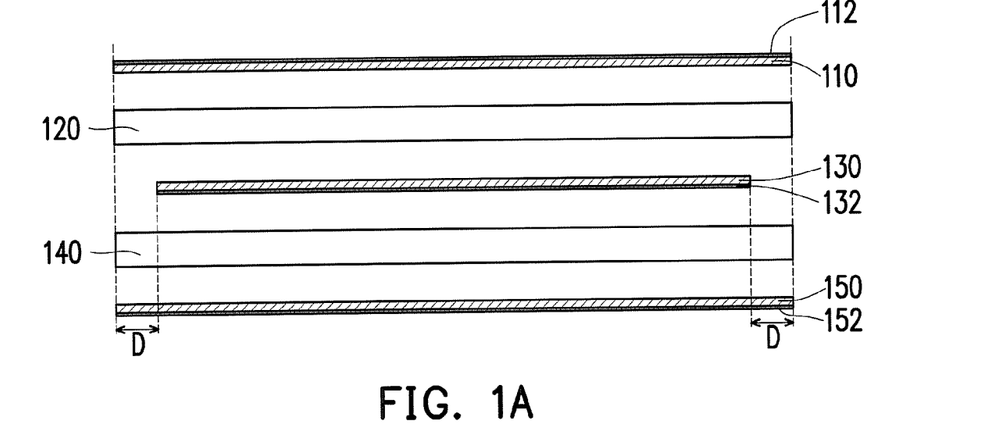
FIG. 1A to FIG. 1K are cross-sectional schematic diagrams illustrating a manufacturing method of a package substrate according to an embodiment of the invention.

FIG. 1A to FIG. 1K are cross-sectional schematic diagrams illustrating a manufacturing method of a package substrate according to an embodiment of the invention. Referring to FIG. 1A, in the manufacturing method of the package substrate according to the present embodiment, a first copper layer 110 and a first plating copper layer 112 formed thereon, a first dielectric layer 120, a second copper layer 130 and a second plating copper layer 132 formed thereon, a second dielectric layer 140, a third copper layer 150 and a third plating copper layer 152 formed thereon is provided. More specifically, the first dielectric layer 120 is located between the first copper layer 110 and the second copper layer 130. The second dielectric layer 140 is located between the second plating copper layer 132 and the third copper layer 150. In particular, edges of the second copper layer 130 of the present embodiment are retracted a distance D compared to edges of the first copper layer 110 and edges of the third copper layer 150, as is shown in FIG. 2. That is to say, a width/length of the second copper layer 130 and the second plating copper layer 132 formed thereon of the present embodiment is smaller than a width/length of the first copper layer 110 and a width/length of the third copper layer 150. In a different embodiment, the width of the second copper layer 130 and the second plating copper layer 132 formed thereon may only be smaller than the width of the first copper layer 110 and the width of the third copper layer 150. In another embodiment, the length of the second copper layer 130 and the second plating copper layer 132 formed thereon may only be smaller than the length of the first copper layer 110 and the length of the third copper layer 150.

As shown in FIG. 1A, in the present embodiment, the first copper layer 110, the second copper layer 130 and the third copper layer 150, for example, are copper foil or electroless plating copper layers. The first plating copper layer 112, the second plating copper layer 132 and the third plating copper layer 152 are formed directly on the first copper layer 110, the second copper layer 130 and the third copper layer 150 respectively by electroplating. That is to say, the edges of the first plating copper layer 112, the edges of the second plating copper layer 132 and the edges of the third plating copper layer 152 may be substantially aligned with or trimmed flush with the edges of the first copper layer 110, the edges of the second copper layer 130 and the edges of the third copper layer 150 respectively. Here, a thickness of the first copper layer 110, a thickness of the second copper layer 130 and a thickness of the third copper layer 150 are greater than a thickness of the first plating copper layer 112, a thickness of the second plating copper layer 132 and a thickness of the third plating copper layer 152 respectively. Preferably, the thickness of the first copper layer 110, the thickness of the second copper layer 130 and the thickness of the third copper layer 150 are between 10 micrometers and 35 micrometers. The thickness of the first plating copper layer 112, the thickness of the second plating copper layer 132 and the thickness of the third plating copper layer 152 are between 1 micrometer and 7 micrometers.

Figure 1B:
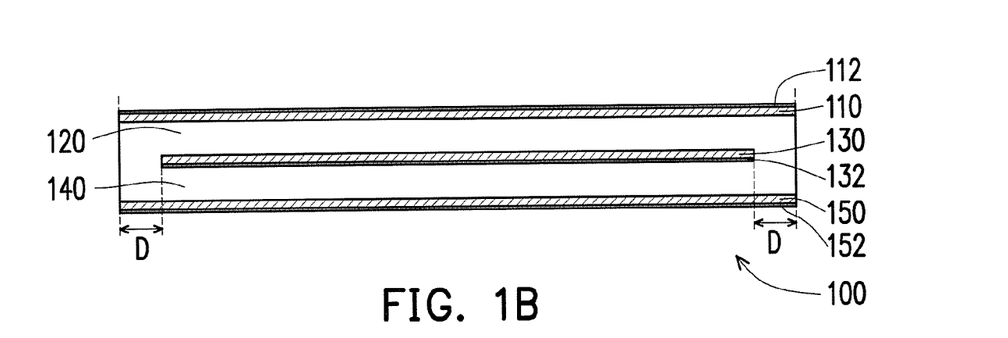
Figure 1C:
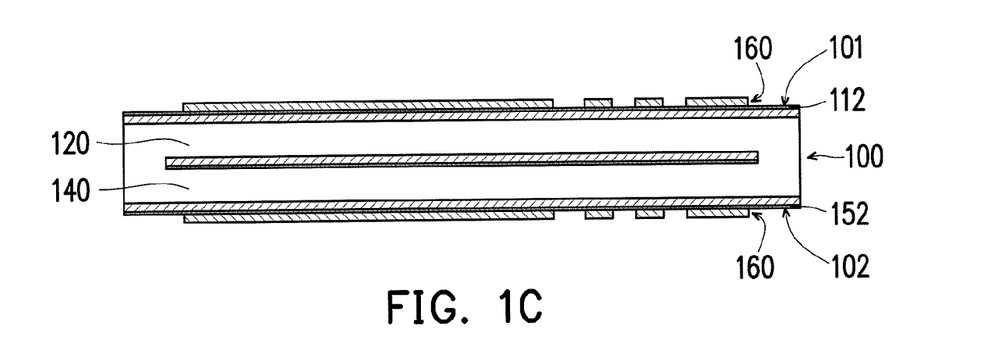
Figure 1D:
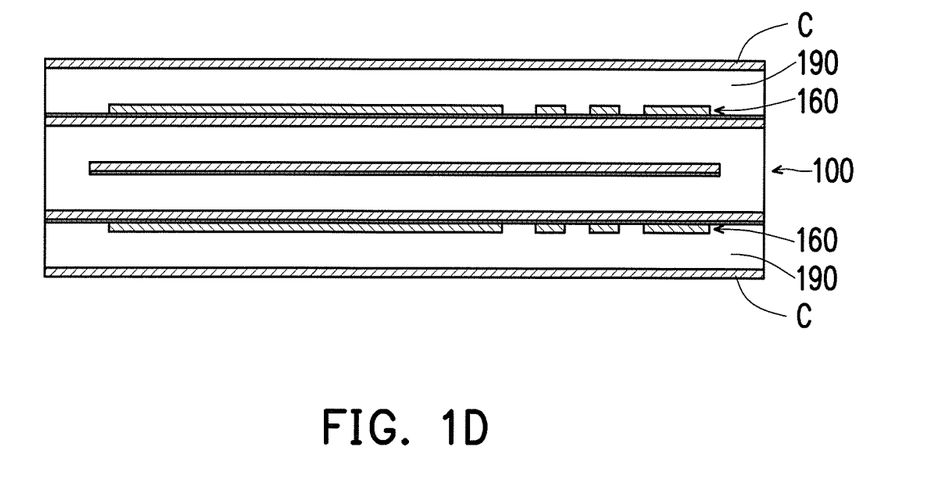
Figure 2:
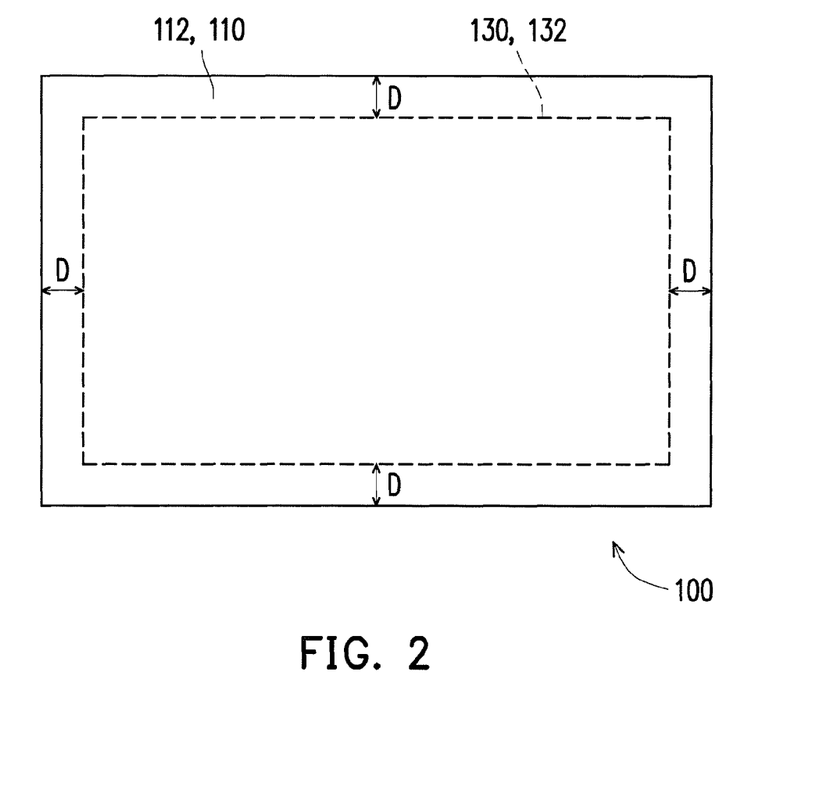
FIG. 2 is a schematic diagram illustrating a top view of a temporary carrier of FIG. 1B.

Referring to FIG. 1B, the first copper layer 110, the first dielectric layer 120, the second copper layer 130, the second dielectric layer 140 and the third copper layer 150 are laminated such that the first dielectric layer 120 and the second dielectric layer 140 completely encapsulate the edges of the second copper layer 130 and the edges of the second plating copper layer 132 formed thereon, and the edges of the first dielectric layer 120 and the edges of the second dielectric layer 140 are substantially aligned with or trimmed flush with the edges of the first copper layer 110 and the edges of the third copper layer 150 so as to form a temporary carrier 100. Here, a method for laminating the first copper layer 110, the first dielectric layer 120, the second copper layer 130, the second dielectric layer 140 and the third copper layer 150 can be thermo-compression bonding.

The first dielectric layer 120 and the second dielectric layer 140 in the present embodiment will be slightly melted due to the temperature during thermo-compression bonding, wherein the slightly melted first dielectric layer 120 and the second dielectric layer 140 will extend to encapsulate the edges of the second copper layer 130 and the edges of the second plating copper layer 132 formed thereon and bond with each other to form a completely sealed border. In this way, the temporary carrier 100 of the present embodiment may have strong sealed borders. Here, the edges of the second copper layer 130 are retracted the distance D compared to the edges of the first copper layer 110 and the edges of the third copper layer 150. The distance D, as shown in FIG. 2, is the retracted distance D from the long side and the short side of the structure. In other embodiments not shown, only the long side of the structure may be retracted a distance, or only a short side of the structure may be retracted a distance, and it should not be construed as a limitation to the invention. In addition, since the first dielectric layer 120 and the second dielectric layer 140 completely encapsulate the edges of the second copper layer 130 and the edges of the second plating copper layer 132, therefore the strength and swelling-shrinkage uniformity of the temporary carrier 100 may be enhanced effectively. That is to say, the second copper layer 130 and the second plating copper layer 132 encapsulated by the first dielectric layer 120 and the second dielectric layer 140 will not produce drastic changes (for example, excessive warping or bending) due to the heating or cooling during manufacturing, such that the temporary carrier 100 may have better structural strength and swelling-shrinkage uniformity.

Figure 1E:
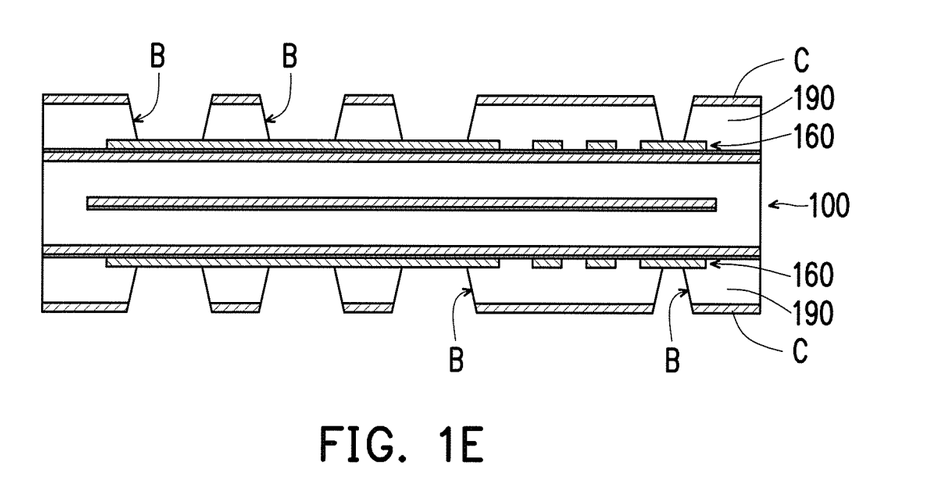
Figure 1F:
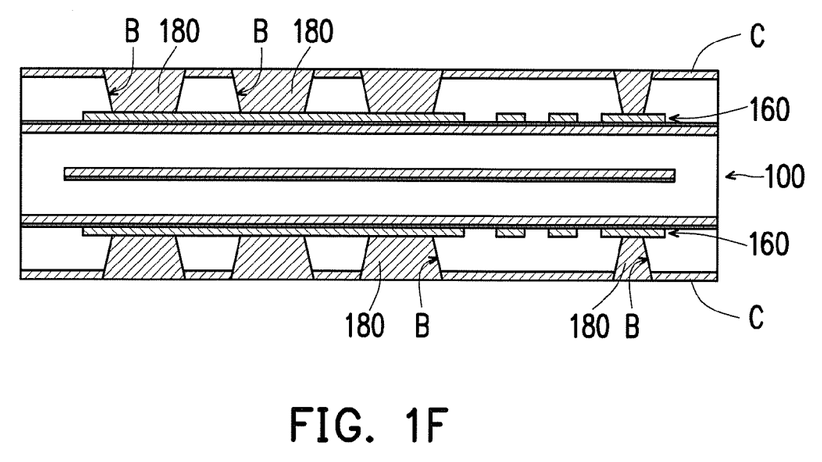
Figure 1G:
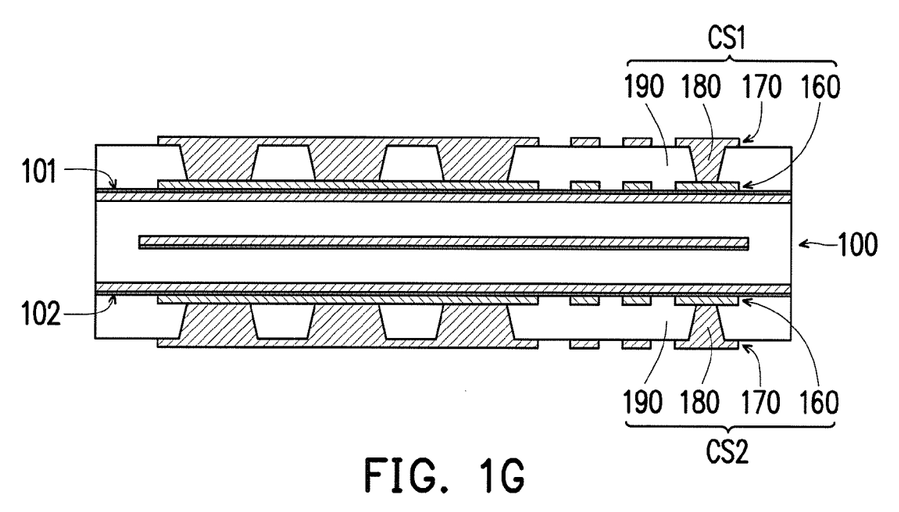

Next, referring to FIG. 1G, two circuit structures CS1, CS2 are formed on two opposite surfaces 101, 102 of the temporary carrier 100, wherein each of the circuit structures CS1 (or CS2) includes at least two patterned circuit layers 160, 170, an insulation layer 190 located between the patterned circuit layers 160, 170, and a plurality of conductive through hole structures 180 penetrating the insulation layer 190 and electrically connected with the patterned circuit layers 160, 170. More specifically, regarding the step of forming the circuit structures CS1, CS2 on the two opposite surfaces 101, 102 of the temporary carrier 100, first referring to FIG. 1C, the patterned circuit layers 160 are respectively formed on the two opposite surfaces 101, 102 of the temporary carrier 100, wherein the patterned circuit layers 160 expose a part of the first plating copper layer 112 and a part of the third plating copper layer 152 respectively. Next, referring to FIG. 1D, the insulation layers 190 and the circuit layers C formed thereon are respectively laminated on the patterned circuit layers 160, wherein a method for laminating the insulation layers 190 and the circuit layers C formed thereon on the patterned circuit layers 160, for example, can be thermo-compression bonding.

Next, referring to FIG. 1E, a part of the insulation layers 190 and circuit layers C are removed to form a plurality of blind holes B exposing the patterned circuit layers 160. Here, a method for removing the part of the insulation layers 190 and circuit layers C, for example, is laser ablation or drilling a hole mechanically, but not limited thereto. Next, referring to FIG. 1F, a plurality of conductive through hole structures 180 are formed in the blind holes B, wherein the conductive through hole structures 180 fill the blind holes B and are connected to the circuit layers C. Here, a method for forming the conductive through hole structures 180, for example, is via filling plating process. Next, referring to FIG. 1G, the circuit layers C are patterned to form another two patterned circuit layers 170, wherein the patterned circuit layers 160 are electrically connected with the patterned circuit layers 170 through the conductive through hole structures 180. Up to this point, the circuit structures CS1, CS2 are formed on the temporary carrier 100.

Figure 1H:
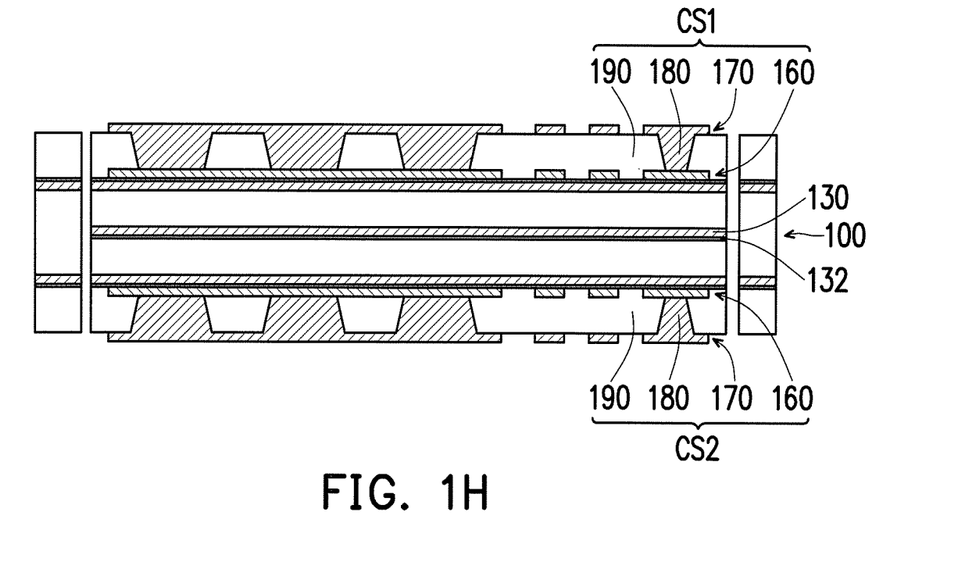

Next, referring to FIG. 1H, the temporary carrier 100 and the circuit structures CS1, CS2 are cut so as to expose the edges of the second copper layer 130 and the edges of the second plating copper layer 132. Here, a method for cutting the temporary carrier 100 and the circuit structures CS1, CS2, for example, is laser cutting or mechanical cutting.

Figure 1I:
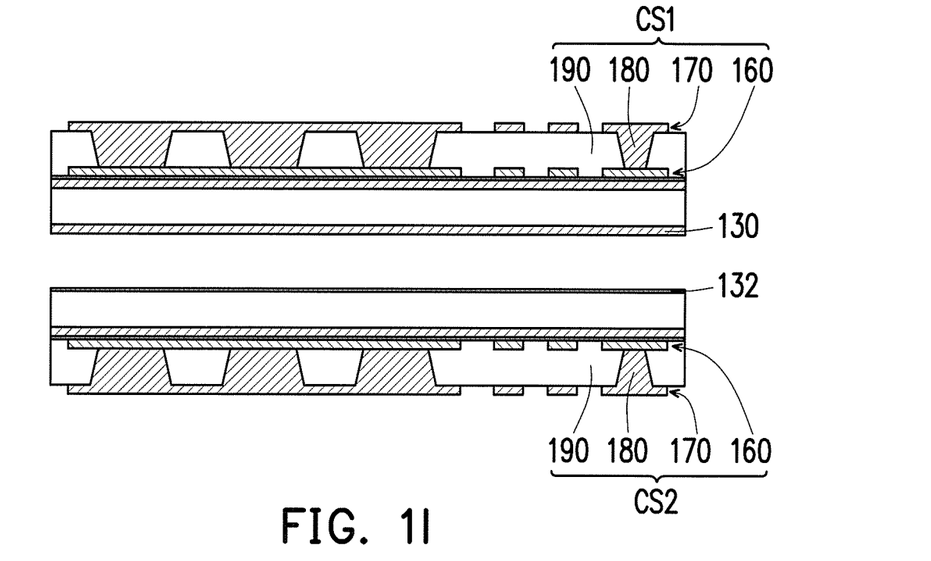
Figure 1J:
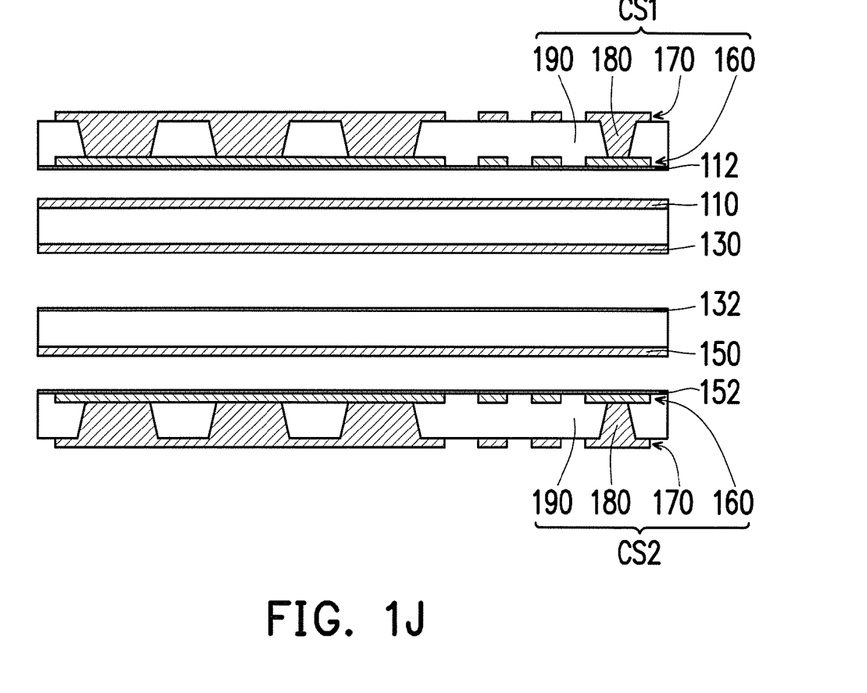
Figure 1K:
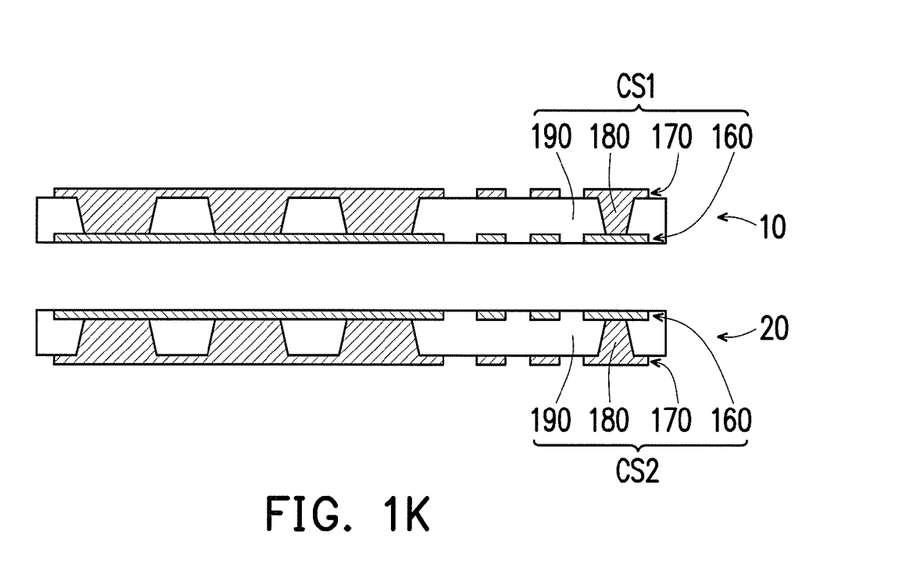

Next, referring to FIG. 1I and FIG. 1K, the temporary carrier 100 and the circuit structures CS1, CS2 are separated along the exposed edges of the second copper layer 130 and the edges of the second plating copper layer 132 so as to form two package substrates 10, 20 independent from each other. More specifically, regarding the step of separating the temporary carrier 100 and the circuit structures CS1, CS2 along the exposed edges of the second copper layer 130 and the edges of the second plating copper layer 132, first referring to FIG. 1I, a first separation process is performed, so as to separate the second copper layer 130 and the second plating copper layer 132. Since the second copper layer 130 and the second plating copper layer 132 are only attached on the surface, therefore the second copper layer 130 and the second plating copper layer 132 may be easily stripped using a mechanical force. Next, referring to FIG. 1J, a second separation process is performed so as to strip the first copper layer 110 and the third copper layer 150 from the first plating copper layer 112 and the third plating copper layer 152 respectively. For example, the first copper layer 110 and the first plating copper layer 112 are stripped using a mechanical force, and the third copper layer 150 and the third plating copper layer 152 are stripped using a mechanical force. Lastly, referring to FIG. 1J and FIG. 1K, a third separation process is performed, so as to separate the first plating copper layer 112 and the third plating copper layer 150 from the patterned circuit layers 160 of the circuit structures CS1, CS2 respectively to form the package substrates 10, 20 independent from each other. At this point the manufacturing of the package substrates 10, 20 are completed. The third separation process may be performed by, for example, stripping using a mechanical force or by micro-etching process.

Since the present embodiment, separates the temporary carrier 100 and the circuit structure CS1, CS2 so as to form independent package substrates 10, 20 along the edges of the second copper layer 130 and the edges of the second plating copper layer 132 which are exposed due to cutting the temporary carrier 100 and the circuit structures CS1, CS2, therefore there is the advantage of where the separating the plates easily.

In summary, since the first dielectric layer and the second dielectric layer of the invention completely encapsulate the edges of the second copper layer and the second plating copper layer which have edges retracted at a distance with respect to the first copper layer and the third copper layer, and the edges of the first dielectric layer and the edges of the second dielectric layer are substantially aligned with or trimmed flush with the edges of the first copper layer and the edges of the third copper layer, namely the first dielectric layer and the second dielectric layer may completely seal the second copper layer and the second plating copper layer, so as to form a completely sealed border, therefore the temporary carrier of the invention may have strong sealed borders. In addition, since the first dielectric layer and the second dielectric layer completely encapsulate the edges of the second copper layer and the edges of the second plating copper layer, therefore the strength and swelling-shrinkage uniformity of the temporary carrier may be enhanced effectively. In addition, the temporary carrier and the circuit structures are separated along the edges of the second copper layer and the edges of the second plating copper layer which are exposed due to cutting the temporary carrier and the circuit structures so as to form two independent package substrates, and therefore may have the advantage of separating the plates easily and increasing the yield of the manufacturing process and separating the plates.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package substrate, comprising:

providing a first copper layer and a first plating copper layer formed thereon, a first dielectric layer, a second copper layer and a second plating copper layer formed thereon, a second dielectric layer, a third copper layer and a third plating copper layer formed thereon, wherein the first dielectric layer is located between the first copper layer and the second copper layer, the second dielectric layer is located between the second plating copper layer and the third copper layer, and edges of the second copper layer are retracted a distance compared to edges of the first copper layer and edges of the third copper layer;

laminating the first copper layer, the first dielectric layer, the second copper layer, the second dielectric layer and the third copper layer such that the first dielectric layer and the second dielectric layer completely encapsulate the edges of the second copper layer and the edges of the second plating copper layer thereon so as to form a temporary carrier, and wherein the edges of the first copper layer and the edges of the third copper layer are substantially aligned to each other;

forming two circuit structures on two opposite surfaces of the temporary carrier, wherein each of the circuit structures include at least two patterned circuit layers, an insulation layer located between the patterned circuit layers, and a plurality of conductive through hole structures penetrating the insulation layer and electrically connected with the patterned circuit layers;

cutting the temporary carrier and the circuit structures so as to expose the edges of the second copper layer and the edges of the second plating copper layer; and separating the temporary carrier and the circuit structures along the exposed edges of the second copper layer and the exposed edges of the second plating copper layer so as to form two package substrates independent from each other.

2. The manufacturing method of a package substrate as claimed in claim 1, wherein a thickness of the first copper layer, a thickness of the second copper layer and a thickness of the third copper layer are greater than a thickness of the first plating copper layer, a thickness of the second plating copper layer and a thickness of the third plating copper layer respectively.

3. The manufacturing method of a package substrate as claimed in claim 2, wherein the thickness of the first copper layer, the thickness of the second copper layer and the thickness of the third copper layer are between 10 micrometers and 35 micrometers.

4. The manufacturing method of a package substrate as claimed in claim 2, wherein the thickness of the first plating copper layer, the thickness of the second plating copper layer and the thickness of the third plating copper layer are between 1 micrometer and 7 micrometers.

5. The manufacturing method of a package substrate as claimed in claim 1, wherein a method for laminating the first copper layer, the first dielectric layer, the second copper layer, the second dielectric layer and the third copper layer is thermo-compression bonding.

6. The manufacturing method of a package substrate as claimed in claim 1, wherein the step of forming the two circuit structures on the two opposite surfaces of the temporary carrier comprises:

respectively forming a patterned circuit layer on the two opposite surfaces of the temporary carrier, wherein the patterned circuit layers respectively expose a part of the first plating copper layer and a part of the third plating copper layer;

respectively laminating an insulation layer and a circuit layer thereon on the patterned circuit layers;

removing a part of the insulation layers and the circuit layers so as to form a plurality of blind holes exposing the patterned circuit layers;

forming the conductive through hole structures in the blind holes, wherein the conductive through hole structures fill the blind holes and are connected to the circuit layers; and patterning the circuit layers to form another two patterned circuit layers, wherein the patterned circuit layers are electrically connected with the another two patterned circuit layers through the conductive through hole structures.

7. The manufacturing method of a package substrate as claimed in claim 1, wherein the step of separating the temporary carrier and the circuit structures along the exposed edges of the second copper layer and the edges of the second plating copper layer comprises:

performing a first separation process, so as to separate the second copper layer and the second plating copper layer;

performing a second separation process, so as to separate the first copper layer and the third copper layer from the first plating copper layer and the third plating copper layer respectively; and performing a third separation process, so as to separate the first plating copper layer and the third plating copper layer from the patterned circuit layers respectively so as to form the package substrates independent from each other.

* * * * *